United States Patent
Haroun et al.

(10) Patent No.: US 9,123,737 B2
(45) Date of Patent: Sep. 1, 2015

(54) CHIP TO DIELECTRIC WAVEGUIDE INTERFACE FOR SUB-MILLIMETER WAVE COMMUNICATIONS LINK

(75) Inventors: Baher S. Haroun, Allen, TX (US); Marco Corsi, Parker, TX (US); Siraj Akhtar, Richardson, TX (US); Nirmal C. Warke, Irving, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 503 days.

(21) Appl. No.: 12/887,323

(22) Filed: Sep. 21, 2010

(65) Prior Publication Data

US 2012/0068891 A1    Mar. 22, 2012

(51) Int. Cl.
*H01Q 1/24* (2006.01)
*H01L 23/66* (2006.01)
*H01L 23/31* (2006.01)
*H01L 23/00* (2006.01)

(52) U.S. Cl.
CPC ............ *H01L 23/66* (2013.01); *H01L 23/3107* (2013.01); *H01L 24/16* (2013.01); *H01L 24/48* (2013.01); *H01L 24/49* (2013.01); *H01L 2223/6677* (2013.01); *H01L 2224/16225* (2013.01); *H01L 2224/16227* (2013.01); *H01L 2224/16245* (2013.01); *H01L 2224/48227* (2013.01); *H01L 2224/48247* (2013.01); *H01L 2224/49175* (2013.01); *H01L 2924/12041* (2013.01); *H01L 2924/3011* (2013.01)

(58) Field of Classification Search
CPC ................................. H01Q 1/24; H01L 23/66
USPC ............................................ 343/702, 700 MS
See application file for complete search history.

(56) References Cited

U.S. PATENT DOCUMENTS

| | | | |
|---|---|---|---|
| 5,528,074 A * | 6/1996 | Goto et al. ................ 257/664 |
| 5,754,948 A | 5/1998 | Metze | |
| 6,967,347 B2 * | 11/2005 | Estes et al. ................ 257/25 |
| 7,330,702 B2 | 2/2008 | Chen et al. | |
| 7,379,713 B2 | 5/2008 | Lindstedt | |
| 7,768,457 B2 | 8/2010 | Pettus et al. | |
| 2002/0053995 A1* | 5/2002 | Kim ........................ 343/853 |
| 2007/0279286 A1* | 12/2007 | Coutts et al. ......... 343/700 MS |
| 2009/0009405 A1* | 1/2009 | Rofougaran ......... 343/700 MS |
| 2009/0009408 A1 | 1/2009 | Rofougaran | |

OTHER PUBLICATIONS

Kenneth K. O, M. C. Frank Chang, Micheal Shur and Wojciech Knap, "Sub-Milimeter Wave Signal Generation and Detection in CMOS", 2009, IEEE, IMS 2009, pp. 185-187.*

* cited by examiner

*Primary Examiner* — Hoang V Nguyen
*Assistant Examiner* — Hai Tran
(74) *Attorney, Agent, or Firm* — Alan A. R. Cooper; Frank D. Cimino

(57) ABSTRACT

In some developing interconnect technologies, such as chip-to-chip optical interconnect or metal waveguide interconnects, misalignment can be a serious issue. Here, however, an interconnect that uses an on-chip directional antenna (which operates in the sub-millimeter range) to form a radio frequency (RF) interconnect through a dielectric waveguide is provided. This system allows for misalignment while providing the increased communication bandwidth.

24 Claims, 3 Drawing Sheets

CHIP TO DIELECTRIC WAVEGUIDE INTERFACE FOR SUB-MILLIMETER WAVE COMMUNICATIONS LINK

CROSS-REFERENCE TO RELATED APPLICATIONS

This application is related to co-pending U.S. patent application Ser. No. 12/887,270, entitled "HIGH SPEED DIGITAL INTERCONNECT AND METHOD," filed herewith, which is hereby incorporated by reference for all purposes.

TECHNICAL FIELD

The invention relates generally to an interconnect system and, more particularly, to chip-to-chip communications with sub-millimeter waves using a dielectric waveguide.

BACKGROUND

Turning to FIG. 1 of the drawings, a conventional interconnect system 100 can be seen. In this system 100, integrated circuits (ICs) 102 and 104 communicate with one another over a communication channel 106. Typically, this communication channel 106 is part of a backplane and is generally a trace (or several metal traces). A problem with this arrangement is that the physical limit for data rates or data transmission is being reached. As a result, several different types of communications links have been or are being developed: optical and wireless links. Each of these developing technologies employs the use of a transmission medium, namely an optical fiber for optical links and a metal waveguide for wireless links. Each of these two technologies, however, have issues related to misalignment.

In FIG. 2, an example of an interface between an IC 202 and optical fiber 204 can be seen. In order to provide a communication link, the IC 202 generally includes an on-die light emitting diode (LED) or photodiode 210, which has an optical axis 206. Usually, the LED 210 (on the transmitter side) is a laser diode, which has a particular wavelength or frequency, and the optical fiber 204 is dimensioned to accommodate the wavelength of the light emitted from LED 210. Typically, the optical fiber 204 is a monomode fiber to improve bandwidth, which has a diameter that is related to the wavelength of the light emitted from LED 210. For example, for near infrared (i.e., wavelength between about 0.7 μm and about 3 μm), a monomode optical fiber will generally have a diameter between about 8 μm and about 10 μm. Thus, a misalignment (of even a few microns) between the optical axis 208 of the optical fiber 204 and the optical axis 206 of the LED (or photodiode) 210 may result is a poor interconnect or no interconnect. Therefore, precision machining or other more exotic micro-optical structures would generally be necessary. The same would also be true for metal waveguides; namely, precision machining would generally be necessary for proper alignment. Metallic waveguides for sub-millimeter waves are also quite lossy substantially limiting the distance over which the waveguides would work.

Therefore, there is a need for an improved interconnect system.

Some other examples of conventional systems are: U.S. Pat. No. 5,754,948; U.S. Pat. No. 7,768,457; U.S. Pat. No. 7,379,713; U.S. Pat. No. 7,330,702; U.S. Pat. No. 6,967,347; and U.S. Patent Pre-Grant Publ. No. 2009/0009408.

SUMMARY

A preferred embodiment of the present invention, accordingly, provides an apparatus comprising: a housing having a receptacle formed therein, wherein the receptacle is adapted to receive at least a portion of a dielectric waveguide; and an integrated circuit (IC) secured within the housing, wherein the IC includes: a directional antenna that is adapted to provide a communication link with the dielectric waveguide; and a steering circuit that is coupled to directional antenna, wherein the steering circuit is adapted to adjust the directional antenna to couple the IC with the dielectric waveguide if the receptacle and directional antenna are misaligned.

In accordance with a preferred embodiment of the present invention, the directional antenna further comprises a phased array having a plurality of radiators.

In accordance with a preferred embodiment of the present invention, each of the radiators further comprises a patch antenna.

In accordance with a preferred embodiment of the present invention, the directional antenna further comprises: a radiator; and a plurality directional elements that substantially surround the radiator, wherein the steering circuit is coupled to each directional element.

In accordance with a preferred embodiment of the present invention, the radiator further comprises a patch antenna.

In accordance with a preferred embodiment of the present invention, the apparatus further comprises: a leadframe; and a plurality of bond wires that are secured to the IC and to the leadframe, wherein each bond wire is secured within the housing.

In accordance with a preferred embodiment of the present invention, an apparatus is provided. The apparatus comprises a plastic housing having a receptacle therein, wherein the receptacle is adapted to receive at least a portion of a dielectric waveguide; an IC encapsulated within the plastic housing, wherein the IC includes: a directional antenna that is adapted to provide a communication link with the dielectric waveguide; and a steering circuit that is coupled to directional antenna, wherein the steering circuit is adapted to adjust the directional antenna to couple the IC with the dielectric waveguide if the receptacle and directional antenna are misaligned; a leadframe that is at least partially encapsulated within the plastic housing; and a plurality of wire bonds to secured to the IC and to the leadframe, wherein each bond wire is encapsulated within the plastic housing.

In accordance with a preferred embodiment of the present invention, an apparatus is provided. The apparatus comprises a plastic housing having a receptacle therein, wherein the receptacle is adapted to receive at least a portion of a dielectric waveguide; an IC encapsulated within the plastic housing, wherein the IC includes: communication circuitry; a directional antenna that is coupled to the communication circuitry and that is adapted to provide a communication link with the dielectric waveguide; and a steering circuit that is coupled to directional antenna, wherein the steering circuit is adapted to adjust the directional antenna to couple the IC with the dielectric waveguide if the receptacle and directional antenna are misaligned; a leadframe that is at least partially encapsulated within the plastic housing; and a plurality of wire bonds to secured to the IC and to the leadframe, wherein each bond wire is encapsulated within the plastic housing.

In accordance with a preferred embodiment of the present invention, the communication circuitry further comprise a transmitter.

In accordance with a preferred embodiment of the present invention, the communication circuitry further comprises a receiver.

In accordance with a preferred embodiment of the present invention, an apparatus is provided. The apparatus comprises a first packaged integrated circuit (IC) that includes: a first housing having a first receptacle formed therein; and a first IC that is secured within the first housing and that includes a first antenna that is located in proximity to the first receptacle; a second packaged IC that includes: a second housing having a second receptacle formed therein; and a second IC that is secured within the second housing and that includes a second antenna that is located in proximity to the second receptacle; and a dielectric waveguide that is secured to the first housing in the first receptacle and the second housing in the second receptacle, wherein the dielectric waveguide is adapted to provide a sub-millimeter wave radio frequency (RF) link between the first and second antennas.

In accordance with a preferred embodiment of the present invention, the first antenna and first receptacle are separated by a portion of the first housing, and wherein the second antenna and second receptacle are separated by a portion of the second housing.

In accordance with a preferred embodiment of the present invention, the dielectric waveguide is between about 1 mm and about 10,000 mm in length.

In accordance with a preferred embodiment of the present invention, each of the first and second antennas are directional antennas, and wherein each of the first and second ICs further comprise first and second steering circuits, respectively, that are each adapted to adjust the respective first and second directional antennas to couple with the dielectric waveguide if the respective first and second receptacles and the respective first and second directional antennas are misaligned.

In accordance with a preferred embodiment of the present invention, the each of the first and second directional antennas further comprises a phased array having a plurality of radiators.

In accordance with a preferred embodiment of the present invention, each of the radiators further comprises a patch antenna.

In accordance with a preferred embodiment of the present invention, the each of the first and second directional antennas further comprises: a radiator; and a plurality directional elements that substantially surround the radiator, wherein the steering circuit is coupled to each directional element.

In accordance with a preferred embodiment of the present invention, the radiator further comprises a patch antenna.

In accordance with a preferred embodiment of the present invention, an apparatus is provided. The apparatus comprises a first packaged IC that includes: a first plastic housing having a first receptacle formed therein; a first IC that is encapsulated within the first housing and that includes a first antenna that is located in proximity to the first receptacle; a first leadframe that is at least partially encapsulated within the first plastic housing; and a first set of wire bonds to secured to the first IC and to the first leadframe, wherein each bond wire from the first set is encapsulated within the first plastic housing; a second packaged IC that includes: a second plastic housing having a second receptacle formed therein; a second IC that is encapsulated within the second housing and that includes a second antenna that is located in proximity to the second receptacle; a second leadframe that is at least partially encapsulated within the second plastic housing; and a second set of wire bonds to secured to the second IC and to the second leadframe, wherein each bond wire from the second set is encapsulated within the second plastic housing; and a dielectric waveguide that is secured to the first housing in the first receptacle and the second housing in the second receptacle, wherein the dielectric waveguide is adapted to provide a sub-millimeter wave RF link between the first and second antennas.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
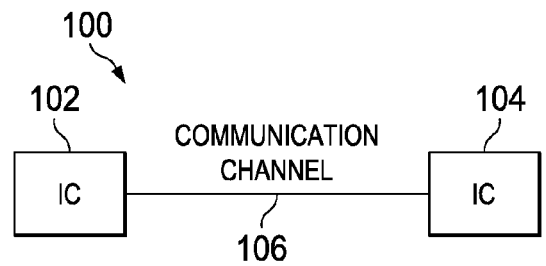
FIG. 1 is a block diagram of a conventional interconnect system.
Figure 2:
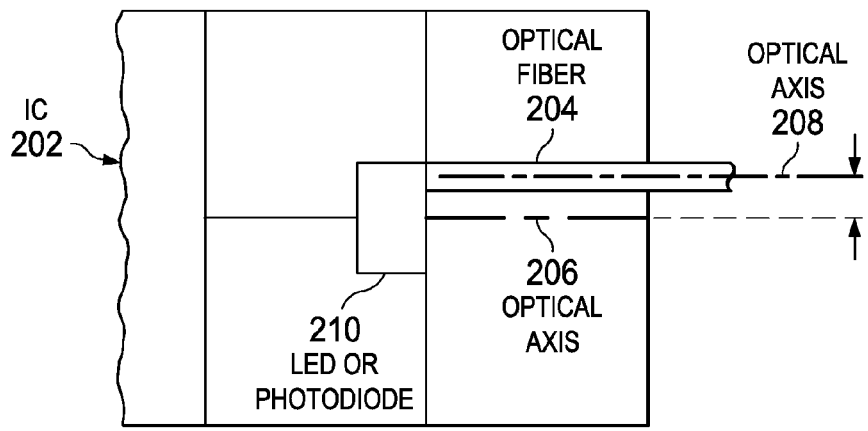
FIG. 2 is a block diagram illustrated the an interface an IC and a optical fiber.

Refer now to the drawings wherein depicted elements are, for the sake of clarity, not necessarily shown to scale and wherein like or similar elements are designated by the same reference numeral through the several views.

Figure 3:
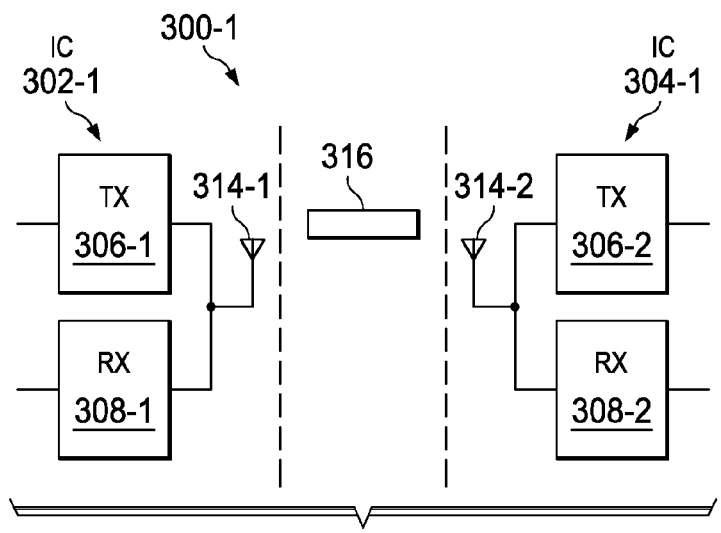
FIGS. 3 through 5 are block diagrams of examples of interconnect systems in accordance with a preferred embodiment of the present invention.
Figure 4:
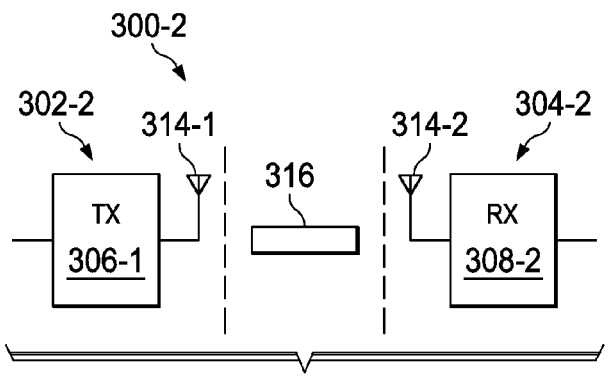

Turning to FIG. 3, an example of system 300-1 in accordance with a preferred embodiment of the present invention can be seen. System 300-1 provides a "wireless" interconnect system between ICs 302-1 and 304-1 using a dielectric waveguide 316. Each of ICs 302-1 and 304-1 respective includes a transmitter 306-1 or 306-2 and a receiver 308-1 or 308-2 which are each respectively coupled to a directional antenna 314-1 or 314-2. Typically, the antennas 314-1 and 314-2 generate radio frequency (RF) signals in the sub-millimeter range (i.e., wavelength of <1 mm), establishing RF links over dielectric waveguide. A similar system for one-way communications (instead of a two-way transceiver as shown with system 300-1) can be seen with system 300-2 in FIG. 4.

Figure 5:
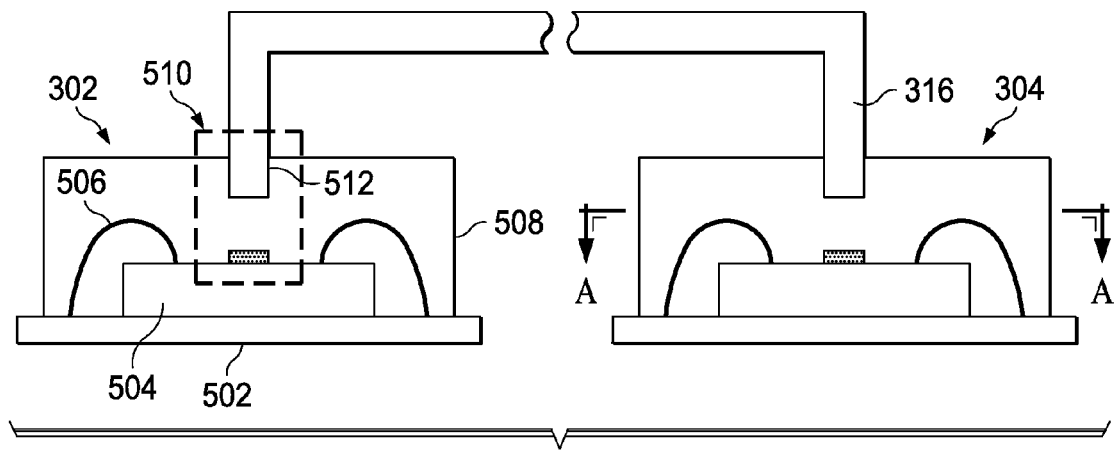

In FIG. 5, an example of a physical layout of system 300-1 or 300-2 can be seen. As shown, each of ICs 302-1/302-2 and 304-1/304-2 (hereinafter referred to as ICs 302 and 304) are packaged ICs having a silicon substrate 504 (with circuitry formed thereon) that is, for example, wire-bonded (via wire bonds 506) to, for example, a leadframe 502. The silicon substrate 504 (also called an IC or "chip") and wire bonds 506 are encapsulated in a plastic or other dielectric housing or packaging material 508. Typically, substrate 504 includes communication circuitry (i.e., transmitter 306-1 or receiver 308-1), a directional antenna (i.e., 314-1), and other functional circuitry. The dielectric waveguide 316 can then be secured to the housing 508 in recess 316 to allow for chip-to-chip communications. Other alternative examples of packages that can be used are ceramic packages, "flip-chip" packages, wafer level chip scale packages (WCSP), and so forth.

Figure 6:
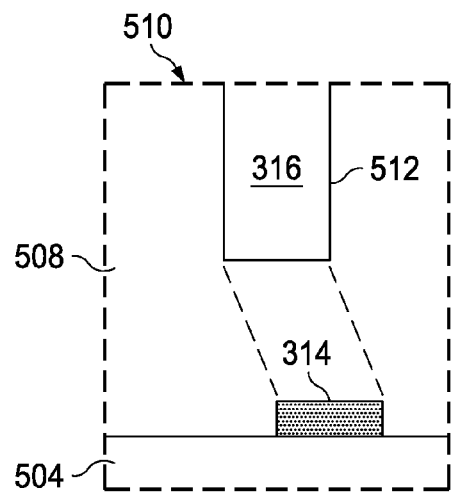
FIG. 6 is a block diagram illustrating an example of misalignment of a dielectric waveguide and a directional antenna for the examples of FIGS. 3 through 5.

Turning to FIG. 6, area 510, which depicts an example of the interface between substrate 504 and dielectric waveguide 316 can be seen in greater detail. As shown, directional antenna 314-1 or 314-2 (hereinafter 314) and dielectric waveguide 316 are misaligned. Such a misalignment for a metal waveguide or optical fiber could (and likely would) severely attenuate a signal. Here, however, because antenna 314 is a directional antenna, the beam formed by antenna 314 can be adjusted to couple with the dielectric waveguide 316, obviating any need for precision machining that may be necessary for optical fibers or metal waveguides. As shown, the recess 514 is formed in the top surface of housing 508, but it can also be formed in a sidewall of housing 508. Additionally, waveguide 316 can be formed of multiple sections or segments that can be coupled together by proximity, which would generally enable easier chip-to-chip communications across different circuit boards or devices.

To accomplish this, high frequency oscillators are built on substrate 504. Advanced CMOS process technologies have transistors as part of the regular process that have power gains of greater than unity at very high frequencies. A high performance 65 nm CMOS process, for example, can have a maximum frequency of greater than 300 GHz, whereas 45 nm, 32 nm, and 28 nm process technologies have progressively faster transistors and within the next decade it is probable that a maximum frequency may exceed 1 THz. Thus, present CMOS process technologies allow oscillators that oscillate at frequencies in the range of about 100-300 GHz. As a result, a high frequency digital signals (i.e., >10 GBPS) can be encoded into such a high frequency carrier (i.e., between about 100-300 GHz) since the fractional bandwidth is relatively small (i.e., the signal frequency is a small fraction of the carrier). Additionally, since the wavelengths of signals in the 100 GHz-1 THz range generally are quite small, the antennas (i.e., 314) can be quite small (i.e. about 10-400 µm).

Figure 7:
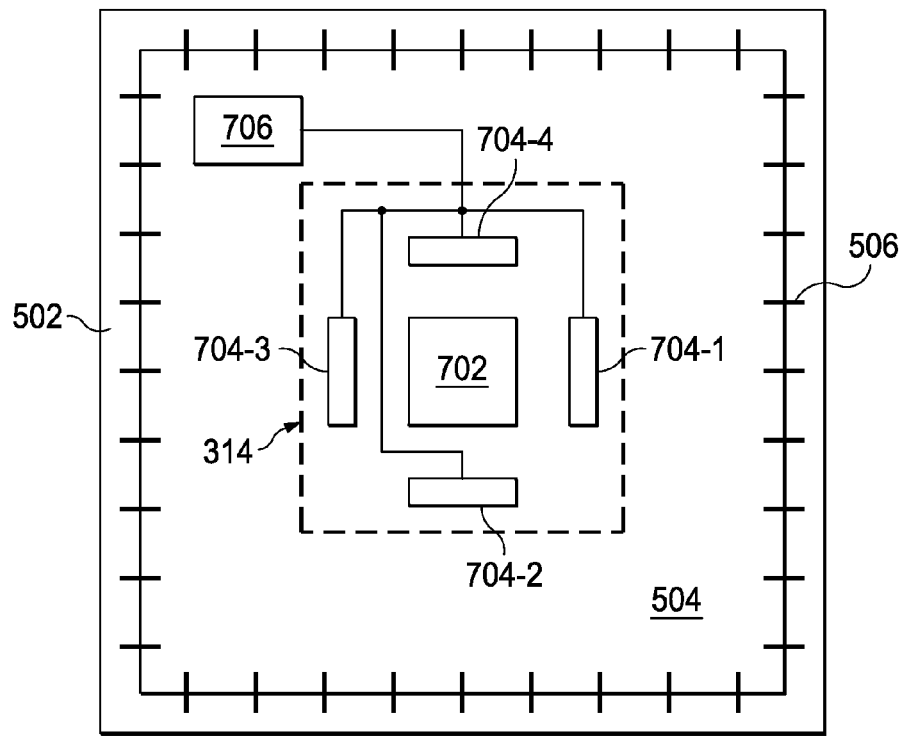
FIGS. 7 and 8 are block diagrams of examples of ICs of FIGS. 3 through 5.

Turning to FIG. 7, an example of a directional antenna 314 can be seen. In this example, directional antenna 314 generally comprises a patch antenna 702 having directional elements 704-1 to 704-4 along the periphery of patch antenna 702. These directional elements 704-1 to 704-4 are typically metal deflectors that are grounded or allowed to float by the steering circuit 706, which controls the direction of the beam emitted by patch antenna 702. Alternatively, Yagi-Uda bond wire antennas, folded dipole antennas, mono-poles antennas, and other radiating structures with a single feed may be used instead of a patch antenna.

Figure 8:
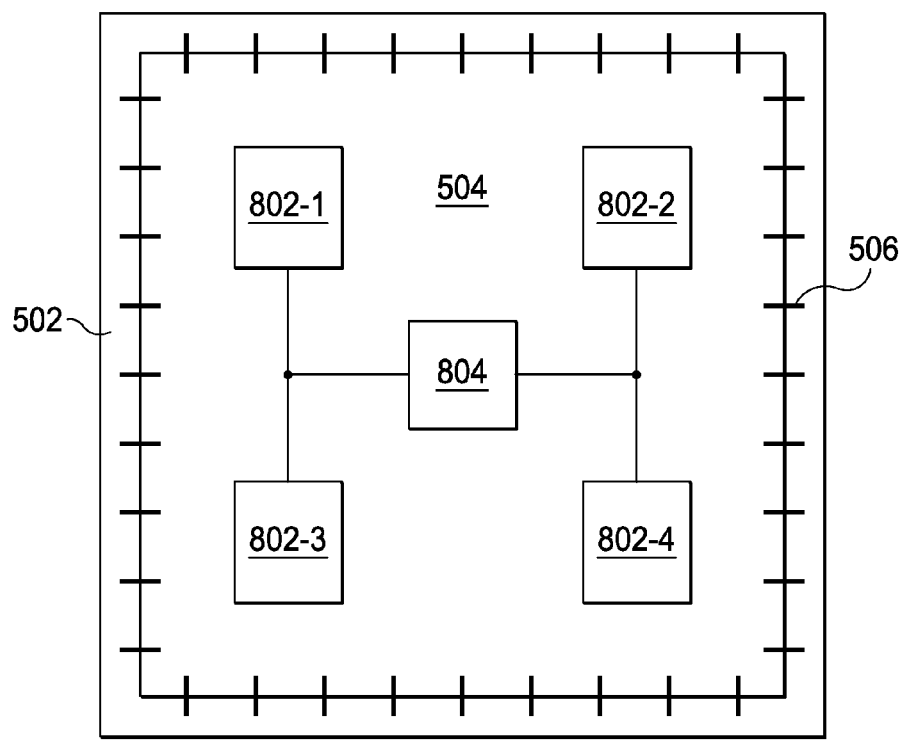

In FIG. 8, another example of a directional antenna 314 can be seen. Here, patch antennas 802-1 to 802-4 form a phased array antenna. This phased array antenna can be controlled by steering circuit 804 so as to control the direction of the beam. An example of such a on-chip phased array system can be found in U.S. patent application Ser. No. 12/878,484, entitled "TERAHERTZ PHASED ARRAY SYSTEM," filed on Sep. 9, 2010, which is related to U.S. patent application Ser. No. 12/871,626, entitled "DOWNCONVERSION MIXER," filed on Aug. 30, 2010, and U.S. patent application Ser. No. 12/888,208, entitled "LOW IMPEDANCE TRANSMISSION LINE," filed on Sep. 22, 2010. Each application is hereby incorporated by reference for all purposes.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a housing having a receptacle formed therein, wherein the receptacle is adapted to receive at least a portion of a dielectric waveguide; and
an integrated circuit (IC) secured within the housing, wherein the IC includes:
a substrate;
a directional antenna that is adapted to provide a communication link with the directional dielectric waveguide; and
a beam steering circuit that is coupled to the directional antenna, wherein the beam steering circuit is adapted to adjust the directional antenna to couple the IC with the directional dielectric waveguide, wherein the beam steering circuit changes an electric propagation characteristic of the directional antenna itself, and wherein the beam steering circuit is contained on or in the IC;
wherein the communication link is sub-millimeter wave RF link that is produced by a high frequency oscillator built on the substrate, wherein the oscillator is constructed by a complementary metal-oxide-semiconductor (CMOS) process technology.

2. The apparatus of claim 1, wherein the directional antenna further comprises a phased array having a plurality of radiators.

3. The apparatus of claim 2, wherein each of the radiators further comprises a patch antenna.

4. The apparatus of claim 1, wherein the directional antenna further comprises:
a radiator; and
a plurality directional elements that substantially surround the radiator, wherein the steering circuit is coupled to each directional element.

5. The apparatus of claim 4, wherein the radiator further comprises a patch antenna.

6. The apparatus of claim 1, wherein the apparatus further comprises:
a leadframe; and
a plurality of bond wires that are secured to the IC and to the leadframe, wherein each bond wire is secured within the housing.

7. The apparatus of claim 1, wherein the sub-millimeter wave radio frequency (RF) link propagates in free space.

8. The apparatus of claim 1, wherein the sub-millimeter wave radio frequency (RF) link propagates without employment of a lens.

9. The apparatus of claim 1, wherein the sub-millimeter wave radio frequency (RF) link propagates through a package material.

10. An apparatus comprising:
a plastic housing having a receptacle therein, wherein the receptacle is adapted to receive at least a portion of a directional dielectric waveguide;

an IC encapsulated within the plastic housing, wherein the IC includes:
a substrate;
a directional antenna that is adapted to provide a communication link with the directional dielectric waveguide; and
a beam steering circuit that is coupled to directional antenna, wherein the beam steering circuit is adapted to adjust the directional antenna to couple the IC with the directional dielectric waveguide; wherein the beam steering circuit changes an electric propagation characteristic of the directional antenna itself, and wherein the beam steering circuit is contained on or in the IC;
a leadframe that is at least partially encapsulated within the plastic housing; and
a plurality of wire bonds to secured to the IC and to the leadframe, wherein each bond wire is encapsulated within the plastic housing,
wherein the communication link is sub-millimeter wave RF link that is produced by a high frequency oscillator built on the substrate, wherein the oscillator is constructed by a complementary metal-oxide-semiconductor (CMOS) process technology.

11. The apparatus of claim 10, wherein the directional antenna further comprises a phased array having a plurality of radiators.

12. The apparatus of claim 11, wherein each of the radiators further comprises a patch antenna.

13. The apparatus of claim 10, wherein the directional antenna further comprises:
a radiator; and
a plurality of directional elements that substantially surround the radiator, wherein the beam steering circuit is coupled to each directional element.

14. The apparatus of claim 13, wherein the radiator further comprises a patch antenna.

15. An apparatus comprising:
a plastic housing having a receptacle therein, wherein the receptacle is adapted to receive at least a portion of a directional dielectric waveguide;
an IC encapsulated within the plastic housing, wherein the IC includes:
a substrate;
communication circuitry;
a directional antenna that is coupled to the communication circuitry and that is adapted to provide a communication link with the dielectric waveguide; and
a beam steering circuit that is coupled to directional antenna, wherein the beam steering circuit is adapted to adjust the directional antenna to couple the IC with the directional dielectric waveguide; wherein the beam steering circuit changes an electric propagation characteristic of the directional antenna itself, and wherein the beam steering circuit is contained on or in the IC;
a leadframe that is at least partially encapsulated within the plastic housing; and
a plurality of wire bonds to secured to the IC and to the leadframe, wherein each bond wire is encapsulated within the plastic housing,
wherein the communication link is sub-millimeter wave RF link that is produced by a high frequency oscillator built on the substrate, wherein the oscillator is constructed by a complementary metal-oxide-semiconductor (CMOS) process technology.

16. The apparatus of claim 15, wherein the directional antenna further comprises a phased array having a plurality of radiators.

17. The apparatus of claim 16, wherein each of the radiators further comprises a patch antenna.

18. The apparatus of claim 15, wherein the directional antenna further comprises:
a radiator; and
a plurality of directional elements that substantially surround the radiator, wherein the steering circuit is coupled to each directional element.

19. The apparatus of claim 18, wherein the radiator further comprises a patch antenna.

20. The apparatus of claim 18, wherein the sub-millimeter wave radio frequency (RF) link propagates in free space.

21. The apparatus of claim 18, wherein the sub-millimeter wave radio frequency (RF) link propagates without employment of a lens.

22. The apparatus of claim 18, wherein the sub-millimeter wave radio frequency (RF) link propagates through a package material.

23. The apparatus of claim 15, wherein the communication circuitry further comprise a transmitter.

24. The apparatus of claim 23, wherein the communication circuitry further comprises a receiver.

* * * * *